(12) United States Patent
Zhang

(10) Patent No.: US 7,088,432 B2
(45) Date of Patent: Aug. 8, 2006

(54) DYNAMIC MASK PROJECTION STEREO MICRO LITHOGRAPHY

(75) Inventor: Xiang Zhang, Los Angeles, CA (US)

(73) Assignee: The Regents of the University of California, Oakland, CA (US)

(*) Notice: Subject to any disclaimer, the term of this patent is extended or adjusted under 35 U.S.C. 154(b) by 0 days.

(21) Appl. No.: 10/380,229

(22) PCT Filed: Sep. 27, 2001

(86) PCT No.: PCT/US01/30604

§ 371 (c)(1),
(2), (4) Date: Aug. 12, 2003

(87) PCT Pub. No.: WO02/27408

PCT Pub. Date: Apr. 4, 2002

(65) Prior Publication Data

US 2005/0259785 A1    Nov. 24, 2005

Related U.S. Application Data

(60) Provisional application No. 60/235,799, filed on Sep. 27, 2000.

(51) Int. Cl.
*G03B 27/32* (2006.01)
*G03B 27/52* (2006.01)
*B29C 35/04* (2006.01)
*C08J 7/04* (2006.01)

(52) U.S. Cl. .................. 355/77; 355/32; 264/401; 427/512

(58) Field of Classification Search ........... 427/510, 427/512, 553, 555; 264/401; 355/32, 53, 355/77
See application file for complete search history.

(56) References Cited

U.S. PATENT DOCUMENTS

| | | | | |
|---|---|---|---|---|
| 5,198,159 A | * | 3/1993 | Nakamura et al. | 264/401 |
| 5,236,637 A | * | 8/1993 | Hull | 264/401 |
| 5,536,467 A | * | 7/1996 | Reichle et al. | 264/401 |
| 5,545,367 A | * | 8/1996 | Bae et al. | 264/401 |
| 5,677,107 A | * | 10/1997 | Neckers | 430/269 |
| 5,870,176 A | * | 2/1999 | Sweatt et al. | 355/53 |
| 6,200,646 B1 | * | 3/2001 | Neckers et al. | 430/510 |
| 6,319,603 B1 | * | 11/2001 | Komiya et al. | 428/378 |

FOREIGN PATENT DOCUMENTS

| WO | WO98/06560 | 2/1998 |
|---|---|---|
| WO | WO 99/63385 | * 12/1999 |

* cited by examiner

*Primary Examiner*—Rodney Fuller
(74) *Attorney, Agent, or Firm*—Berliner & Associate

(57) ABSTRACT

Three-dimensional structures are fabricated by a process in which a 3D solid model is designed by software at a PC and sliced into a series of 2D layers. Each 2D layer is displayed at a dynamic mask via micro-mirror deflections projected onto a photoresist to form a layer, which is lowered and the process is repeated to build the object layer by layer.

14 Claims, 1 Drawing Sheet

DYNAMIC MASK PROJECTION STEREO MICRO LITHOGRAPHY

CROSS REFERENCE TO RELATED APPLICATIONS

Figure 1:
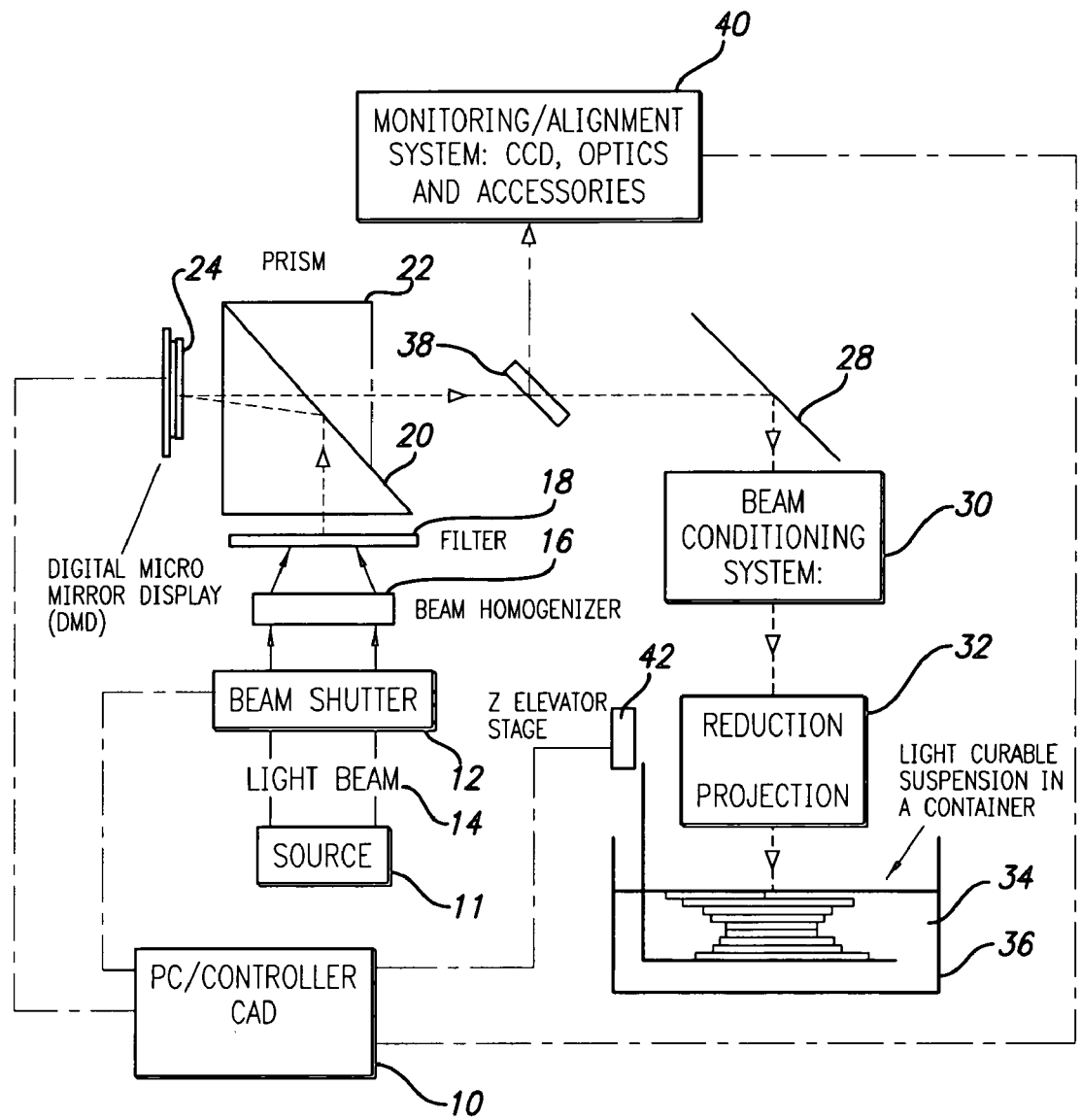

This application is based on U.S. Application Ser. No. 60/235,799, filed Sep. 27,2000.

FIELD OF THE INVENTION

The field of the invention is microfabrication of 3D structures

BACKGROUND OF THE INVENTION

Micro-electro-mechanical systems (MEMS) devices have been found in many sensing applications such as airbag sensors, as well as chemical and biological sensors. The use of micro actuators is the key to making MEMS fully active, intelligent "micro-system" devices, capable of both sensing and actuating. Current IC-based micromachining processes, used to fabricate MEMS devices, have certain limitations in achieving the above goals. First, most of the IC-based micromachining processes cannot be used to fabricate complex 3D micro parts with high aspect ratios. Second, only a few semiconductors and other materials can be processed by the current IC-based micromachining for MEMS. Many other important engineering materials, such as smart ceramics, functional polymers, and metal alloys, can not be directly incorporated into MEMS through the conventional IC-based micromachining processes.

As an alternative, an x-ray LIGA (German Lithography, electroforming and molding) process was developed to fabricate microstructures with high aspect ratio. However, the x-ray LIGA process has not found a large number of industrial applications due to its poor industrial accessibility and operational cost. In addition, complex 3D structures can not be achieved by an LIGA process. A novel microfabrication process, the micro stereolithography (μSL) was introduced to fabricate high aspect ratio and complex 3D microstructure by single beam scanning. [Ikuta, K., Ogata, T., and Kojima, S., 1996, "Development of mass productive micro stereo lithography", Proc. IEEE MEMS'96, pp. 301–305.]

Sophisticated 3D parts can be made by scanning an UV beam on a liquid monomer resin, curing the resin into solid polymer layer by layer, and stacking together all layers with various contours.

Recently, liquid crystal display projection micro-stereolithography has been used by groups in Europe to project a layer image onto the photo-resist. However, due to the large pixel size and very low transmission in UV, the device's resolution is limited and contrast is poor. Macro scale stereo-lithography, on the other hand, has been around for more than 15 years, mainly with single beam scanning, and commercial applications in this area have also been established such as by 3D Systems Inc. Only recently, scientists have started to use digital light processing technology, for example, using a commercial digital micro-mirror display projector from Texas Instrument to do macro-scale stereo-lithography. However, they use mainly a commercial optical setup from Texas Instruments and focus on macro-scale fabrication for structure and automotive applications rapid prototyping. See, also, U. S. Pat. No. 6,200,646 to Neckers et al, entitled: "Method For Forming Polymeric Patterns, Relief Images And Colored Polymeric Bodies Using Digital Light Processing Technology."

SUMMARY OF THE INVENTION

The present invention uses micro stereolithography to provide a new method to fabricate 3D micro or nano structures that can be used for a wide variety of devices such as micro/nano-electronics, biotechnology, MEMS, biomedical devices and in the manufacture of optical devices such as lenses and mirrors. The invention is based on using advanced dynamic mask projection stereo micro-lithography on a photoresist to form a layer, building an object layer by layer, to achieve ceramic micro-stereolithography for the first time. A 3D solid image, which may be a model designed by CAD software at a PC, is sliced into a series of 2D layers, each 2D layer being displayed at the dynamic mask via micro-mirror deflections projected onto the photoresist.

Using individually addressed micro mirrors, gray tone images can be achieved and 3D object can be formed by one exposure. The gray tone of the micro mirrors also provides a unique method to compensate for light field aberrations due to optical elements such as lenses and apertures, ensuring a uniform light field with ordinary optics. This is especially useful for future aberration-free optical engineering and lithography in micron or sub-micron electronics.

More particularly, a method and apparatus are provided for forming a three-dimensional structure from a computer-stored image in which one of a plurality of sequential two-dimensional slices of a computer stored image is used to control a digital micro-mirror display arranged to reflect actinic light to a photo-curable composition as an image of the selected slice. The reflected light image is focused to a first location in the composition to cure a two-dimensional layer therein corresponding to said selected two-dimensional slice. The process is repeated with sequentially selected slices focused to sequential locations in the composition until the three-dimensional structure is formed.

The foregoing has outlined rather broadly the features and technical advantages of the present invention in order that the detailed description of the invention that follows may be better understood. The foregoing, and additional features and advantages of the invention will be described hereinafter, form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS AND TABLES

FIG. 1 is a schematic depiction of the method of this invention.

DETAILED DESCRIPTION

The present invention is used to fabricate 3D complex micro/nano structures by digital light processing using a dynamic mask. Digital light processing technology is a high brightness and contrast, high resolution technique composed of a micro-electro-mechanical semiconductor based array of small, fast independently hinged reflective surfaces (or mirrors) the combination of which is known as a digital micromirror device or display (DMD). The reflective surfaces, each of which represents a single pixel, can be of very small size, in the micrometer range, or even smaller. In a non-limiting embodiment, reflective surfaces are in the range of 0.1–17 μm. They are square mirrors that can reflect light in two directions, namely "on" and "off." In the on position, the mirrors reflect light through the optics onto or into the object being exposed and the mirrors appear bright. Conversely, when the mirrors are in the off position, the light is reflected out of the optical field and the mirrors appear dark. Thus when a DMD is combined with a light source, an image processor, and optics, it can be utilized to precisely control the pattern of the light source using this binary pulse width modulation technique.

A DMD can also control the intensity of the pattern pixels. Using binary pulse width modulation or other signaling techniques, the amount of time the mirrors are in the off and on positions can be precisely controlled. By quickly switching a particular mirror between the on and off positions or pulsing the mirror, the effective intensity of light at the object surface is controlled. When the mirror is continuously on (corresponding to a white pixel) the effective intensity at the object surface is high. However, if the mirror is modulated between the on and off state, the effective intensity can be precisely controlled based on the amount of time the mirror is in the on position. For example, using known digital light processing technology, a single DMD system can generate 256 gray levels.

An example of a useful dynamic mask is a digital mirror based display device sold commercially by Texas Instruments and which has 17 μm mirrors, micro-second response time, and high contrast and definition compared with other display devices such as liquid crystal devices. Other programmable arrays which operate in a fashion similar to the Texas Instruments DMD may be utilized.

Referring to FIG. 1, a 3D solid model is designed by any suitable method, e.g., by bit mapping or by computer aided design (CAD) software at a PC/controller 10. The CAD model is then electronically sliced into series of 2-dimensional data files, ,i.e., 2D layers, each defining a planar cross section through the device to be constructed, and which may be individually stored. Alternatively, the slices may be applied directly in real time. In either event, each 2D layer data is used to control a DMD display via the PC 10. A beam shutter 12, which may be an electronic or mechanical shutter, or any other type, is controlled by the PC 10 and in turn controls a light beam 14 which then travels through a beam homogenizer 16 and a narrow band filter 18, impinging on the mirror 20 of a prism 22 to reflect therefrom to a DMD chip 24.

The DMD chip 24 is formed with more than a half million mirrors, each individually addressed electronically and deflecting a homogenized light beam back through the prism 22. Actinic wavelengths of the image pass a beam splitter 38 and is then reflected by a mirror 28 to a beam conditioning system 30 which consists of appropriate apertures and lenses, and then to and through a reduction projection system 32 (which is available commercially from lithography tool companies). The projected image is in focus at a particular plane in a photoresist/photo-curable composition 34 in a supporting container 36 so that the actinic light preferentially exposes the desired layer to cure it.

A source of actinic light 11 may be any number of available sources, including, but not limited to metal halide, tungsten halogen and xenon lamps or lasers, e.g., an ultraviolet light laser. A beam splitter 38 is used to assist monitoring/alignment for the fabrication. At the beginning or during each layer fabrication, the same light imaged on the resin surface can be reflected back through the same projection optics 32, beam conditioning system 30, mirror 28, and finally reflected by the beam splitter 38 into a monitoring system 40 which consists of a CCD and other optical accessories.

After one layer is cured, or at least partially cured sufficient to retain its integrity, the composition and focusing optics undergo relative movement. In a particular embodiment of the invention, a computer controlled z elevator stage 42 that carries the cured layer moves down and a second layer of fresh photoresist is formed to be exposed. The layer-by-layer process continues until a 3D object is fabricated. The elevator motion, beam on/off, and micro-mirror display are synchronized and controlled by the computer 10.

The photo resist, i.e., photo-curable composition, can be material obtained using conventional techniques in photochemistry and photopolymer chemistry which are familiar to those skilled in the art. The photoimaging and polymerization steps may employ a liquid, semi-solid or solid photopolymerizable composition which is cured by actinic radiation such as ultraviolet, visible or infrared irradiation, depending on the photopolymer. Specific examples include HDDA (the 1,6-hexanediol diacrylate) and other commercially available (from Ciba) stereolithography acrylate (SL 5149) and hybrid epoxy-acrylate resins (SL 5170) with light initiators, such as BEE (Benzoin ethyl ether), added. Other monomers, photoinitiators, dopant and other components that can be used will be apparent to one skilled in the art. In a significant embodiment of the invention, dopant is added to the photo-curable composition. This is very useful in controlling the penetration depth of each 2D layer, enabling the fabrication of truly 3D micro or nano scale structures, especially for overhang structures. The dopant is a light absorbing chemical such as Tinuvin (by Ciba Geigy Corp.) dispersed in the photo-curable resin or composition. Amounts of dopant from 0.1 to 5% can generally be used. In general, monomers or oligomers or mixtures thereof are used, and may be composed of acrylates, including mono and multifunctional acrylates and methacrylates; epoxides such as epoxycyclohexane derivatives; or hybrid mixtures of both acrylate and epoxides. Such compositions contain appropriate photoinitiators such that light of the desired wavelength activates the initiation of the polymerization reaction.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and/or steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method for forming a three-dimensional structure from a computer-stored image, comprising the steps of:
    (a) providing a photo-curable composition;
    (b) providing a source of actinic light for curing said composition;
    (c) arranging a digital micro-mirror display to reflect said actinic light to said composition;
    (d) providing a computer stored image;
    (e) computer-generating a plurality of sequential two-dimensional slices from said image;
    (f) using said plurality of sequential two-dimensional slices to sequentially control said digital micro-mirror display to reflect said actinic light to said composition as sequential images of said selected slice;
    (g) passing said reflected light images through a reduction projection system to enhance resolution; and
    (h) sequentially focusing said reflected light images to a plurality of successive locations in said composition to at least partially cure successive two-dimensional layers therein corresponding to said sequential two-dimensional slices until the three-dimensional structure is formed;
    wherein a portion of said reflected light is used to view the composition as said three-dimensional structure is being formed.

2. The method of claim 1 in which said computer-stored image is a solid 3D model.

3. The method of claim 2 in which said model is a CAD image.

4. The method of claim 1 in which said sequential locations are vertical locations.

5. The method of claim 4 in which actinic light reflected from said digital micro-mirror display is focused by optics to a predetermined vertical location, and wherein sequential locations in said composition are obtained by relative vertical movement of said composition and said optics.

6. The method of claim 5 in which sequential locations in said composition are obtained by sequential downward vertical movement of said composition.

7. The method of claim 1 in which a light absorbing chemical dopant is dispersed in the photo-curable composition, for precisely controlling the curing depth.

8. An apparatus for forming a three-dimensional structure in a photo-curable composition from a computer-stored image, comprising:
    a source of actinic light for curing said composition;
    a digital micro-mirror display arranged to reflect said actinic light to said composition;
    a computer for providing a computer stored image and generating a plurality of sequential two-dimensional slices from said image;
    means for using said sequential two-dimensional slices to control said digital micro-mirror display to sequentially reflect said actinic light to said composition as a sequence of images of said slices;
    means for focusing and enhancing resolution of said reflected light images sequentially to a plurality of locations in said composition to at least partially cure successive two-dimensional layers therein corresponding to said sequential two-dimensional slices whereby to enable the three-dimensional structure to be formed; and
    means for viewing a portion of said reflected light whereby to enable viewing of the composition as said three-dimensional structure is being formed.

9. The apparatus of claim 8 in which said computer-stored image is a solid 3D model.

10. The apparatus of claim 9 in which said model is a CAD image.

11. The apparatus of claim 8 in which said sequential locations are vertical locations.

12. The apparatus of claim 11 in which the means for focusing and enhancing resolution of said reflected light images comprises optics focusing said actinic light reflected from said digital micro-mirror display to a predetermined vertical location, and means for relative vertical movement of said composition and said optics.

13. The apparatus of claim 12 in which said means for relative vertical movement of said composition and said optics comprises means for sequential downward vertical movement of said composition.

14. The apparatus of claim 13 in which said means for sequential downward vertical movement of said composition comprises a computer controlled z elevator stage carrying the composition.

* * * * *